(12) United States Patent
Tokuda

(10) Patent No.: US 7,398,504 B2
(45) Date of Patent: Jul. 8, 2008

(54) PROGRAM, METHOD AND APPARATUS FOR ANALYZING TRANSMISSION SIGNALS

(75) Inventor: Kazuhiko Tokuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 288 days.

(21) Appl. No.: 11/203,118

(22) Filed: Aug. 15, 2005

(65) Prior Publication Data

US 2005/0273740 A1    Dec. 8, 2005

Related U.S. Application Data

(63) Continuation of application No. PCT/JP2004/007816, filed on Jun. 4, 2004.

(30) Foreign Application Priority Data

Jun. 10, 2003  (JP)  ................ PCT/JP03/07329

(51) Int. Cl.
*G06F 17/50* (2006.01)
(52) U.S. Cl. ................ 716/18; 716/4; 716/5; 716/6
(58) Field of Classification Search ............ 716/18, 716/4–6
See application file for complete search history.

(56) References Cited

U.S. PATENT DOCUMENTS

| 2002/0007477 A1 | 1/2002 | Hisada |
| 2002/0032555 A1 | 3/2002 | Suwada et al. |
| 2002/0099510 A1 | 7/2002 | Namiki |
| 2003/0072130 A1 | 4/2003 | Tsang et al. |

FOREIGN PATENT DOCUMENTS

| EP | 1 083 502 | 3/2001 |
| EP | 1083502 | 3/2001 |
| JP | 2000-35984 | 2/2000 |
| JP | 2002-163320 | 6/2002 |

OTHER PUBLICATIONS

European Search Report, mailed Dec. 7, 2006, and issued in corresponding European Patent Application No. 04745592.8-2224.

*Primary Examiner*—Jack Chiang
*Assistant Examiner*—Brandon W Bowers
(74) *Attorney, Agent, or Firm*—Staas & Halsey LLP

(57) ABSTRACT

From design information on a circuit board a wiring designation unit designates a wiring model for signal analysis. A first analysis unit generates, through a 3-D electromagnetic analysis, a first output waveform received at a receiving end of a wiring model when a first input signal pattern changing from 0 to 1 is input to a sending end of the wiring model. A second analysis unit generates, through the 3-D electromagnetic analysis, a second output waveform received at the receiving end of the wiring model when a second input signal pattern changing from 1 to 0 is input to the sending end of the wiring model. An output waveform generation unit selects the first output waveform at bit 1 of a random signal of about 100 bits and selects the second output waveform at bit 0 thereof to generate for a predetermined bit count the first output waveform or the second output waveform selected with each bit position as a starting point. An output waveform synthesis unit synthesizes the output waveforms for the bit count to generate an output waveform received at the receiving end when the random signal is input to the sending end of the wiring model.

17 Claims, 12 Drawing Sheets

PRIOR ART
FIG. 3A    Vr
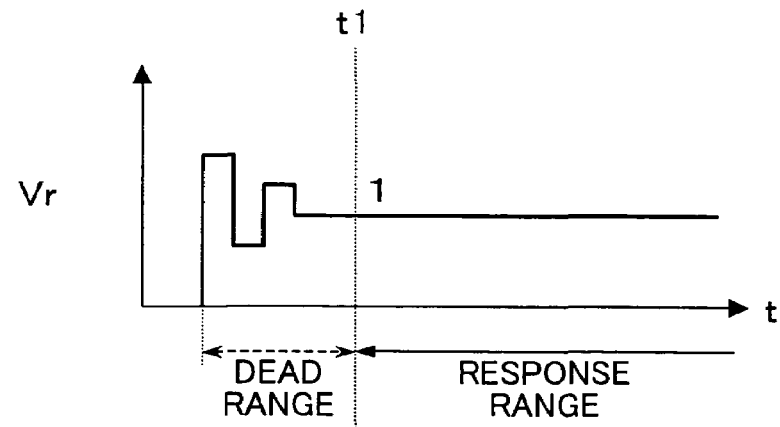
PRIOR ART
FIG. 3B    LOAD
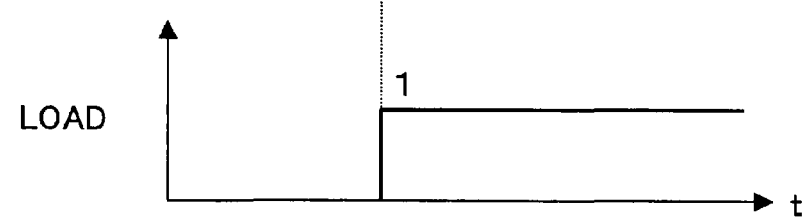
PRIOR ART
FIG. 4A    Vr
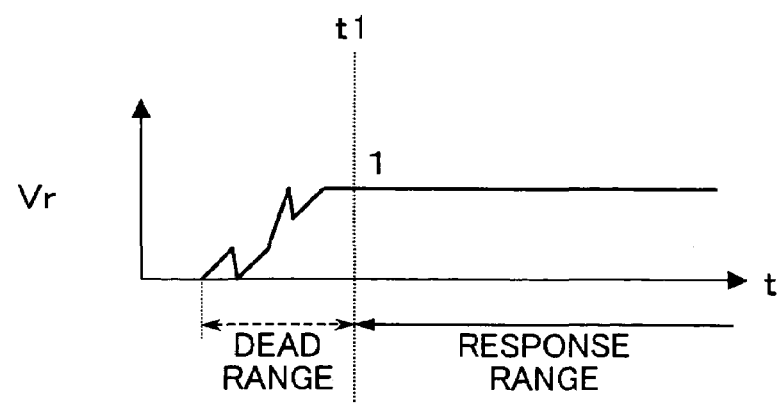
PRIOR ART
FIG. 4B    LOAD
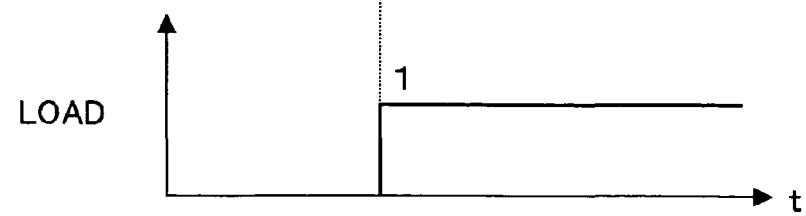

FIG. 9A RANDOM INPUT SIGNAL Ei 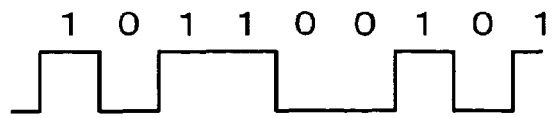

FIG. 9B FIRST BIT DECOMPOSITION SIGNAL E1 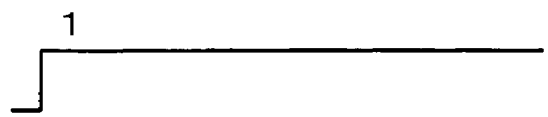

FIG. 9C SECOND BIT DECOMPOSITION SIGNAL E2 

FIG. 9D THIRD BIT DECOMPOSITION SIGNAL E3 

FIG. 9E FOURTH BIT DECOMPOSITION SIGNAL E4 

FIG. 9F FIFTH BIT DECOMPOSITION SIGNAL E5 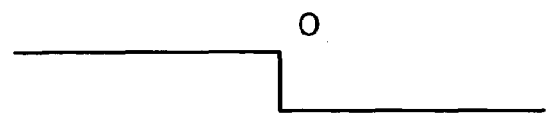

FIG. 9G SIXTH BIT DECOMPOSITION SIGNAL E6 

FIG. 9H SEVENTH BIT DECOMPOSITION SIGNAL E7 

FIG. 9I EIGHTH BIT DECOMPOSITION SIGNAL E8 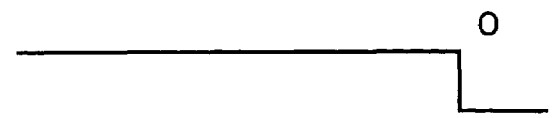

FIG. 9J NINTH BIT DECOMPOSITION SIGNAL E9 

FIRST INPUT SIGNAL PATTERN

SECOND INPUT SIGNAL PATTERN

SIGNAL PATTERN WHOSE CONTENT SHOWS NO CHANGE WITH PRECEDING 1 BIT SIGNAL

FIRST INPUT SIGNAL PATTERN

FIRST ANALYSIS OUTPUT PATTERN

SECOND INPUT SIGNAL PATTERN

SECOND ANALYSIS OUTPUT PATTERN

FIRST BIT OUTPUT
SIGNAL E101

SECOND BIT OUTPUT
SIGNAL E102

THIRD BIT OUTPUT
SIGNAL E103

FOURTH BIT OUTPUT
SIGNAL E104

FIFTH BIT OUTPUT
SIGNAL E105

SIXTH BIT OUTPUT
SIGNAL E106

SEVENTH BIT OUTPUT
SIGNAL E107

EIGHTH BIT OUTPUT
SIGNAL E108

NINTH BIT OUTPUT
SIGNAL E109

SYNTHESIS OUTPUT
SIGNAL $E_0$

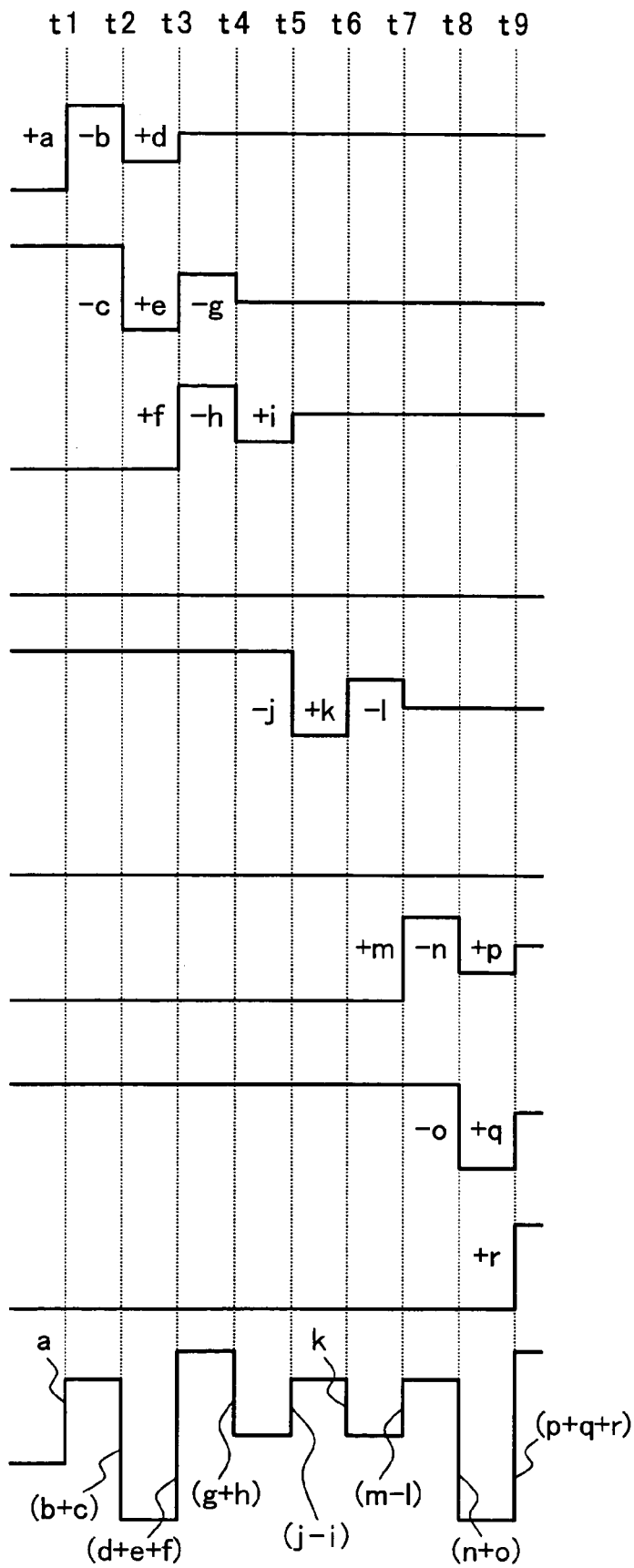

PROGRAM, METHOD AND APPARATUS FOR ANALYZING TRANSMISSION SIGNALS

This application is a continuation of PCT/JP04/07816, filed Jun. 4, 2004.

This PCT application is a priority based on prior application of PCT/JP03/07329, filed Jun. 10, 2003.

TECHNICAL FIELD

The present invention relates generally to a method, program and apparatus for analyzing transmission signals of a circuit board mounted with a CPU whose operating frequency exceeds gigahertz. More particularly the invention relates to a program, method and apparatus for analyzing transmission signals through 3-D electromagnetic field analysis using a random signal of the order of 100 bits.

BACKGROUND ART

In recent years, computer makers have been increasing the number of operating frequency of CPU, the control center of a computer to allow CPU to transmit enormous amounts of control signals in a short time and to shorten the controlling time thereby to raise the data processing speed. For example, operating frequency of CPU was 1 GHz in 2001. In 2002 operating frequency became 2 GHz and in 2003 operating frequency is about to reach 3 GHz. As operating frequency of CPU increased, however, the problem of return noise demanding solution surfaced.

In voltage wave and current wave, generally there exist an incident wave propagating in the positive direction and a reflected wave propagating in the reverse direction at the same time in case a load impedance Zr is connected to a receiving end 104 of a line 100 of a finite length of a length 1 from a sending end 102 as shown in FIG. 1.

If the characteristic impedance of the line 100 is ZO and assuming the voltage upon a signal arriving at the receiving end 104 to be Va and the reflected voltage generated at the receiving end 104 to be Vr, the following will hold true.

Vr/Va=(Zr−ZO)/(Zr+ZO)=m (1)

where m is a reflection coefficient at the receiving end. The reflected wave of the receiving end 104 returns to the sending end 102 and reflects at the sending end again and moves toward the receiving end 104. As long as the reflection coefficient m is not 0, the reflected wave of the receiving end 104 repeats the above.

FIG. 2 shows the change caused by reflection of voltage Va of the sending end 102 and voltage Vr of the receiving end 104 shown in FIG. 1. If transmission time is made to be t0, the signal arrives at the receiving end 104 with the propagation delay time of the line 100. In this situation, the voltage Vr of the receiving end 104 is the sum of the voltage Va of the incident wave from the sending end 102 and the voltage of the reflected wave.

The reflected wave at this time also arrives at the sending end 102 falling behind just the same td with the propagation time delay of the wiring and reflects. The reflected wave is capable of becoming a negative by impedance; therefore, as the reflected wave repeats a reflected wave, the voltage Vr of the receiving end 104 subsides and settles at the voltage Va sent from the sending end 102.

In general, the load low in the response level is also used for the load Zr at the receiving end 104 when transmission signal frequency is low. In other words, as shown in FIG. 3B and FIG. 4B, reflection is repeated before the sensitivity of the load becomes valid at time t1 as shown in FIG. 3A. Then either the voltage Vr at the receiving end settles down to a constant voltage or during the rise time of the signal up to time t1 as shown FIG. 4A, the reflection of the voltage Vr settles down and becomes constant. Therefore, the load does not make an error.

However, when operating frequency of CPU is made high, the load with high sensitivity is used to make the load compatible with CPU. Accordingly, the width of a signal determined by a clock also becomes shorter. FIG. 5A illustrates repetition of reflection. When operating frequency of CPU is high, the load responds to the reflection and acts erratically as shown in FIG. 5B.

The voltage at the receiving end changes as shown in FIG. 5A in case "111" were sent from the sending end, for example. The load makes error of judging the "111" as "101." In recent years operating frequency exceeded GHz. To make such a CPU operate normally, it became important to solve the problem of return noise of transmission waveforms.

Methods to analyze and confirm signal waveforms of the receiving end using 3-D electromagnetic analysis exist. In those methods random signals consisted of bit streams of about 100 bits are input for analysis and confirmation of waveforms. Among those methods, eye pattern analysis is most widely known.

A problem of signal transmission in transmission path of a circuit board carrying CPU is that return noise is invariably generated in a transmission waveform. Depending on the row of the signal of 1 and 0, return noise overlaps and sometimes the overlapping reaches the level at which an error occurs.

In eye pattern analysis a row of random signals consisted of bit streams of about 100 bits are to be made an input waveform. The signal waveform obtained at the receiving end from the signal transmission is superimposed bit-by-bit and displayed. On the display, the signal waveform is made in the length of 1 bit. In this way, eye pattern analysis makes it easy to observe the quality of the transmission signals and to differentiate a bad transmission waveform from a good transmission waveform.

Patent Document 1: EP 1083501 A1
Patent Document 2: Japanese Patent Application Laid-Open Publication No. 2000-35984
Patent Document 3: U.S. 2002/0032555 A1
Patent Document 4: Japanese Patent Application Laid-Open Publication No. 2002-163320EP

DISCLOSURE OF THE INVENTION

However, there are problems associated with simulation for observing each transmission waveform under the influence of return noise to determine whether a transmission waveform is good or bad. One of the problems is that it takes several hours of analysis time because many signals reaching to 100 bits must be input to the sending end.

Usually, in the circuit analysis of wiring, the wiring to be analyzed is to be made a model with the electronic circuit components of resistor R, inductance L, and capacitance C. However, when operating frequency of CPU exceeded 1 GHz, several problems associated with signal transmission surfaced. These problems are caused under the influences of skin effect, dielectric loss, and electromagnetic waves. The skin effect refers to the concentration of current on the surface of wiring; dielectric loss generates from the binding between wiring and ground; electromagnetic waves propagate to the location outside wiring. Due to these problems, general purpose electronic circuit simulators known as SPICE (Simulation Program with Integrated Circuit Emphasis) cannot cope with the operation of determining good or bad transmission waves.

For this reason, simulators using 3-D electromagnetic field analysis are used in recent years. In 3-D electromagnetic analysis, Maxwell's equation is used and electromagnetic field is directly calculated. In this method calculation on how electromagnetic waves transmit from the source of signal is carried out. The locations of the electromagnetic fields include a wiring portion and an outside wiring portion. The simulator displays voltage and current at the last phase. Thus developers can perform analysis to which the influence of high frequency is included.

Various methods of 3-D electromagnetic analysis exist. Among those methods Finite Difference Time-Domain Method (FDTD) is suited to computer simulation. FDTD digitizes Maxwell's equation directly with time and space. The method is highly versatile and is capable of parallel computing.

However, a simulator using Finite Difference Time-Domain Method (FDTD) takes a considerable amount of calculation time even just for analyzing a signal. It is because in the method 3-D electromagnetic analysis space is divided into a minute rectangular solid (cell) using the rectangular coordinate system; and the divided minute numbers of cells reach to the order of one million.

In addition, calculation time of several hours is needed for eye pattern analysis even if a high performance computer is used; because the analysis is performed using 3-D electromagnetic analysis making a row of random signals cons of about 100 bit streams to be input waveforms. Thus, eye pattern has a problem of taking too much time in simulation.

The present invention is intended for a wiring model needing 3-D electromagnetic analysis. The object of the invention is to provide a program, method and apparatus for analyzing transmission signals that allow users to obtain the result of analysis of random signals of a multiplicity of bits needed for generating an eye pattern efficiently in short time.

The present invention provides a transmission signal analysis program. The transmission signal analysis program of the invention is operable to cause a computer to execute:

a step of designating a wiring model including a sending end and a receiving end for signal analysis from a design information of a circuit board;

an analysis step of analyzing and generating output waveforms received at the receiving end when a signal pattern is input to the sending end;

an output waveform generation step of selecting the output waveforms depending on the bits of a random signal of a predetermined bit count and generating, for the predetermined bit count, the output waveforms selected with each bit position as a starting point; and a waveform synthesis step of synthesizing the output waveforms for the predetermined bit count to generate output waveforms received at the receiving end when the random signal is input to the sending end.

At the step of designating a wiring model, a wiring and a load are connected to the receiving end. The analysis step includes analyzing and generating a first output waveform received at the receiving end when a signal pattern changing from 0 to 1 is input to the sending end, and the analysis step includes analyzing and generating a second output waveform received at the receiving end when a signal pattern changing from 1 to 0 is input to the sending end.

According to the method for analyzing transmission signals by the present invention, users analyze until the time when return noises on two types of signals changing from 0 to 1 and 1 to 0 settle down. Users then synthesize the signal waveforms of random signals that have a multiplicity of bits needed for displaying eye pattern at a receiving end and the result of analyzing the two types of signals. By employing this method, users can obtain the result of analysis in short time.

The present invention of this application is based on the following knowledge held by the inventors. It becomes clear that the random signals are two basic types of signal changing from 0 to 1 and 1 to 0 when the input random signals to display eye pattern are decomposed. Therefore, it also becomes clear that the random input signals of these two types of signal can be reproduced at later time by synthesis. The same thing can be said about waveforms at the receiving end after transmission.

In other words, the output signal waveforms of receiving waves obtained by analyzing the basic input signals changing from 0 to 1 and from 1 to 0 are to be said the basic signals decomposed the output signals obtained as the result of transmitting random signals of 100 bits. Accordingly, the results of the transmission of random signals of 100 bits are easily obtained by synthesizing two types of basic output signal waveforms obtained by matching the two types of basic output signal waveforms at the bit position and by analyzing them.

The analysis step includes analyzing and generating output waveforms for the time a return noise subsides. For example, the analysis step includes analyzing and generating output waveforms for the time equal to several times of the signal transmission time.

Upon inputting a first and second input signal patterns, the reflection noises of output waveforms at the receiving end reach the level of becoming trouble free as signals repeat going and returning a transmission line 2 or 3 times. Therefore, the analysis of the input signals will be sufficient if it is performed until the signals finish three round trips of the transmission line. The rest will be fine with continuation of the final voltage. No more analysis time is needed.

The analysis step includes analyzing and generating output waveforms for the time equal to several times of the signal transmission time. The analysis step includes using a 3-D electromagnetic analysis of the wiring model to generate the output waveforms. The analysis step includes analyzing the output waveforms with the transmission clock frequency of the wiring model equal to or greater than 1 GHz.

In the present invention, what is needed for this 3-D electromagnetic field analysis is to input the first and the second input signal patterns and to allow the signals make two or three round trips on the transmission line. The analysis only takes about 30 minutes using the 3-D electromagnetic field analysis for which the conventional analysis required several hours to complete.

The output waveform generation step includes selecting the first output waveform at bit 1 of the random signal of the predetermined bit count and selecting the second output waveform at bit 0 to generate, for the predetermined bit count, the first output waveform or the second output waveform selected with each bit position as the starting point.

The waveform synthesis step includes generating a synthesized waveform that reverses for each bit period of the random signal and that has a waveform variation equal to the sum of the positive or negative change of a single or a plurality of output waveforms at each reversal timing. The random signal is a bit stream of more than 100 bits.

The transmission signal analysis program of the present invention is further operable to drive the computer to execute an eye pattern display step, by an eye pattern display unit 26, of generating and displaying an eye pattern from the output waveform generated by the waveform synthesis.

The present invention provides a transmission signal analysis method. The transmission signal analysis method comprises:

a step of designating a wiring model including a sending end and a receiving end for signal analysis from a design information of a circuit board;

an analysis step of analyzing and generating output waveforms received at the receiving end when a signal pattern is input to the sending end;

an output waveform generation step of selecting the output waveforms depending on the bits of a random signal of a predetermined bit count and generating, for the predetermined bit count, the output waveforms selected with each bit position as a starting point; and a waveform synthesis step of synthesizing the output waveforms for the predetermined bit count to generate output waveforms received at the receiving end when the random signal is input to the sending end.

The present invention provides a transmission signal analysis apparatus. The transmission signal analysis apparatus comprises:

a wiring model designation unit designating a wiring model including a sending end and a receiving end for signal analysis from a design information of a circuit board;

an analysis unit analyzing and generating output waveforms received at the receiving end when a signal pattern is input to the sending end;

an output waveform generation unit selecting the output waveforms depending on the bits of a random signal of a predetermined bit count, the output waveform generation unit generating, for the predetermined bit count, the output waveforms selected with each bit position as a starting point; and a waveform synthesis unit synthesizing the output waveforms for the predetermined bit count to generate output waveforms received at the receiving end when the random signal is input to the sending end.

The details of the transmission signal analysis method and apparatus of the present invention are fundamentally the same as those of the transmission signal analysis program.

The invention is intended for a wiring model and the analysis is performed for the two types of signals changing from 0 to 1 and from 1 to 0. The analysis is a 3-D electromagnetic field analysis and is to be done until return noise subsides. After the analysis the output waveforms influenced by return noise at a receiving end are generated. Then, using these two types of output waveforms, the signal waveforms of random signals of a multiplicity of bits at the receiving end needed for displaying eye pattern are generated and synthesized. Thus, the results of the analysis of the signal waveforms influenced by return noise seen at the receiving end, of random signals with a multiplicity of bits, can be obtained in short time.

In the past for the 3-D electromagnetic field analysis of bits for several minutes of random signals required several hours of the analysis time, for example. In contrast, the 3-D electromagnetic analysis in this invention only requires the time needed for the two types of input signals to make round trips of two or three on the transmission line. In the way of example, the time needed for processing is only about 30 minutes. The result of the analysis can be obtained in about one-tenth of the time in comparison with the time needed for the analysis performed in the past and the method is capable of displaying eye pattern.

BRIEF DESCRIPTION OF THE DRAWINGS

FIGS. 3A and 3B are time charts of the receiving end voltage and a load action in that operating frequency is low and a load response is slow when step change was made for input signals at the sending end;

FIGS. 4A and 4B are time charts of the receiving end voltage and the load action in that operating frequency is low and the load response is slow when lamp change was made for input signals at the sending end;

FIGS. 9A to 9J are time charts decomposing random signals used for transmission signal analysis;

FIGS. 14A to 14J are time charts showing how to synthesize the output signals of each bit on FIGS. 13A to 13J;

BEST MODE FOR CARRYING OUT THE INVENTION

Figure 1:
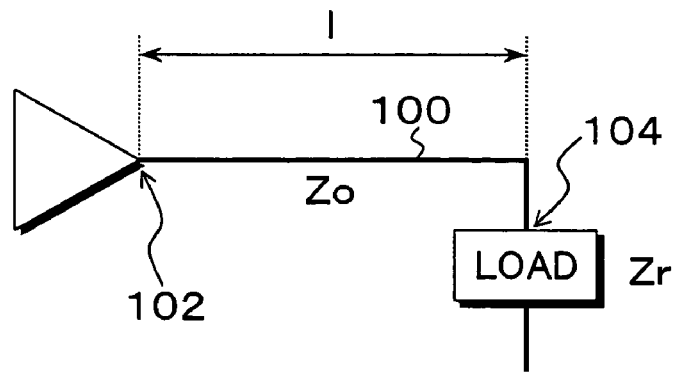
FIG. 1 is an explanatory diagram of a general line model.
Figure 2:
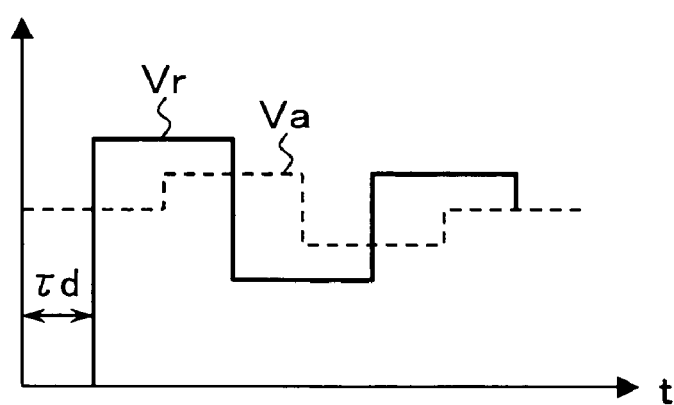
FIG. 2 is a time chart of each voltage of a sending end and a receiving end receiving influences of return noise.
Figure 5A:
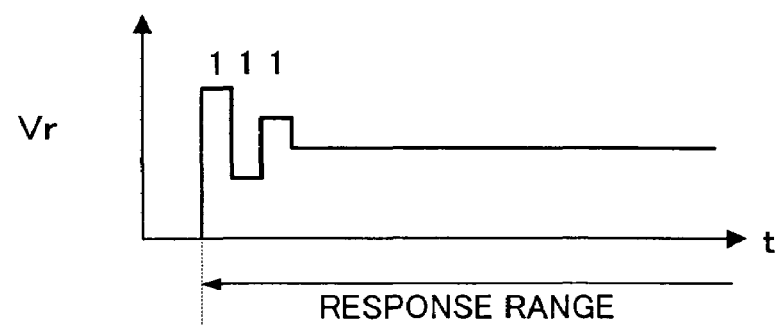
FIGS. 5A and 5B are time charts of the receiving end voltage and the load action in that operating frequency is high and the load response is quick when step change was made for input signals at the sending end.
Figure 5B:
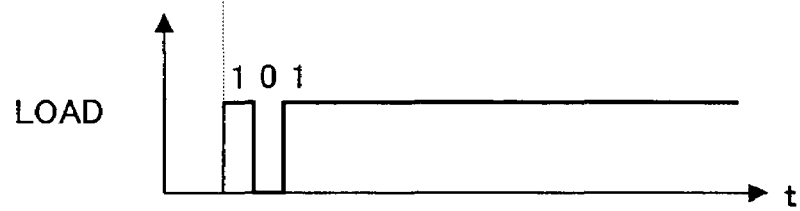
Figure 6:
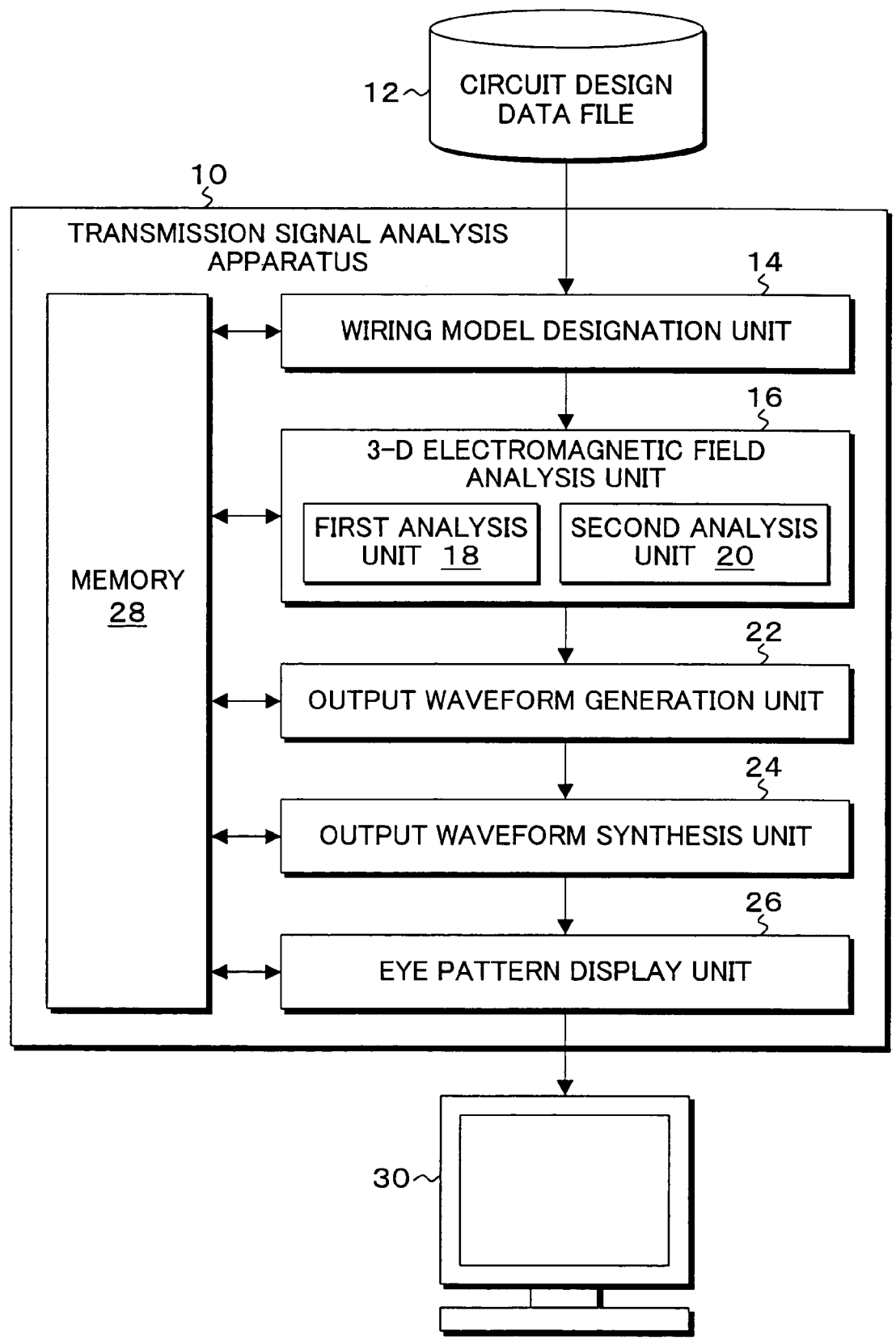
FIG. 6 is a block diagram of a functional structure showing the embodiment of the invention.

FIG. 6 is a block diagram of a functional structure showing an embodiment of a transmission signal analysis apparatus according to the invention. In FIG. 6, a transmission signal analysis apparatus 10 is consisted of a wiring model designation unit 14, a 3-D electromagnetic field analysis unit 16, a first analysis unit 18, a second analysis unit 20, an output waveform generation unit 22, an output waveform synthesis unit 24, an eye pattern display unit 26 and a memory 28.

In the transmission signal analysis apparatus, the first analysis unit 18 and the second analysis unit 20 are included as a function of the 3-D electromagnetic analysis unit 16. The wiring model designation unit 14 designates a wiring model from design information on circuit boards such as printed circuit boards stored in a circuit board design data file 12. The designated wiring model analyzes transmission signals. The wiring model is a model in which a sending end is connected at one end and a receiving end is connected at the other end. The sending end is an output for software such as a driver. A load is connected at the receiving end.

In the 3-D electromagnetic field analysis unit 16, for a example, a simulator executing Finite Difference Time-Domain Method (FDTD) is used. FDTD digitizes Maxwell's equation directly with time and space. As a simulator including the 3-D electromagnetic analysis unit 16, "Electromagnetic Wave Analysis Software FJ-FDTD" by Fujitsu Limited can be used, for example.

When a first input signal pattern changing from 0 to 1 is input to the sending end of the wiring model, the first analysis unit 18 placed in the 3-D electromagnetic analysis unit 16 uses the 3-D electromagnetic analysis to analyze a first input signal pattern and to generate a first output waveforms at the receiving end of the wiring model. When a second input signal pattern changing from 1 to 0 is input to the sending end of the wiring model, the second analysis unit 20 uses the 3-D electromagnetic analysis to analyze the second input signal pattern and to generate a second output waveforms at the receiving end of the wiring model.

As a way of example, the output waveform generation unit 22 selects the first waveform generated at the first analysis unit 18 with bit 1 from random signals for creating the eye pattern of 100 bits. Along with the selection, the output waveform generation unit 22 selects the second output waveform generated at the second analysis unit 20 with bit 0. Then making each bit of the random signals as a starting point generates the first output waveforms or the second output waveforms selected for the number of bits of the random signals.

The output waveform synthesis unit 24 synthesizes dummy random signals corresponding to the number of bits generated at the output waveform generation unit 22. For example, if the synthesized random signals are 100 bits, the synthesized output waveforms would correspond to 100 bits of dummy random signals. Then when the random signals are input to the sending end of the wiring model, the output waveform synthesis unit 24 generates the output waveforms received at the receiving end. When 100 bits of random signals are obtained at the output waveform synthesis 24, the eye pattern display unit 26 superimposes the output waveforms receiving influences of return noise in the width of 1 bit to create the eye pattern and to display the created eye pattern on a display unit 30.

Figure 7:
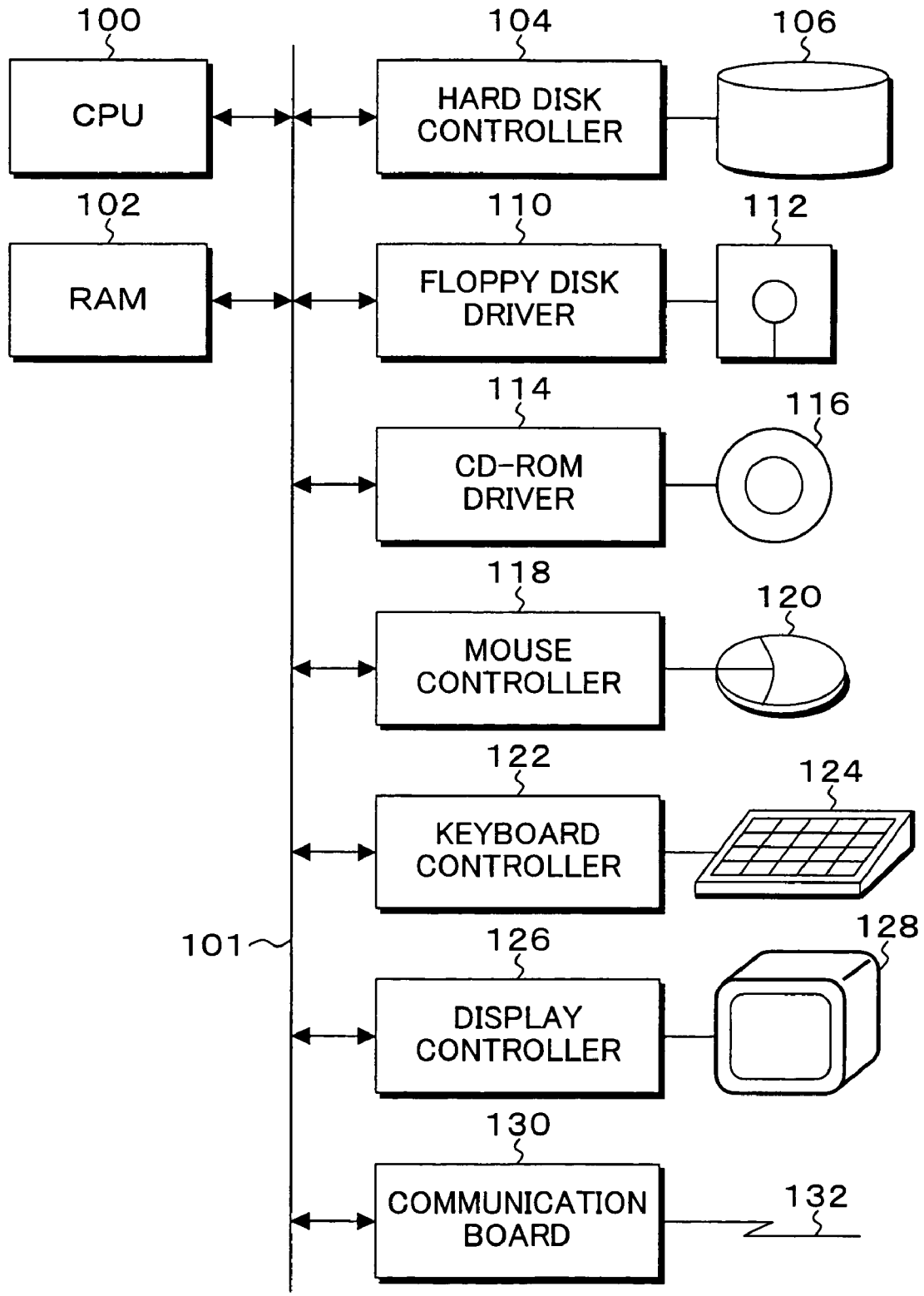
FIG. 7 is a block diagram of hardware environment of a computer to which the invention is applied.

The transmission signal analysis apparatus 10 in FIG. 6 is implemented in hardware resources of a computer such as shown in FIG. 7. In the computer in FIG. 7, a RAM 102, a hard disk controller (software) 104, a floppy disk driver (software) 110, a CD-ROM driver (software) 114, a mouse controller 118, a keyboard controller 122, a display controller 126, a communication board 130 are connected to a bus 101 in a CPU 100.

The hard disk controller 104 is connected to the hard disk drive 106 and loads a program executing transmission signal analysis processing of the invention. When the computer starts, the hard disk controller 104 calls the necessary program from the hard disk drive 106, develops the program on the RAM 102, and executes the program through CPU.

As a floppy disk drive (hardware) 112 is connected to the floppy disk driver 110, reading and writing of a floppy disk (R) is enabled. For the CD-ROM driver 114, the CD drive (hardware) 116 is connected. The data and programs stored in the CD, therefore, can be read.

The mouse controller 118 conveys the input operation of a mouse 120 to the CPU 100. The keyboard controller 122 conveys the input operation of a keyboard 124 to the CPU 100. The display controller 126 executes display on the display unit 128. The communication board 130 uses a communication line 132 to communicate through networks such as the Internet. The communication board 130 includes wireless networks.

Figure 8A:
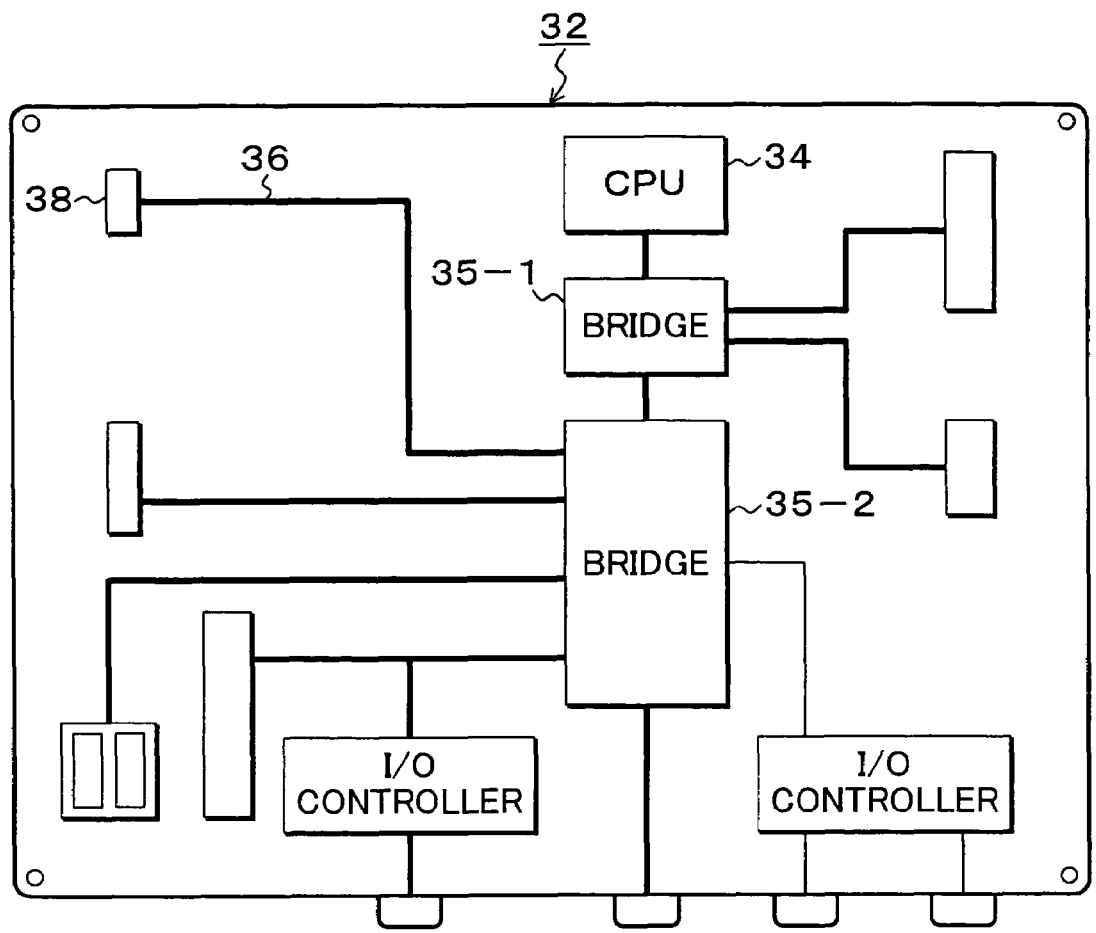
FIGS. 8A and 8B are explanatory diagrams of a circuit board and a wiring model analyzing transmission signals according to the invention.
Figure 8B:
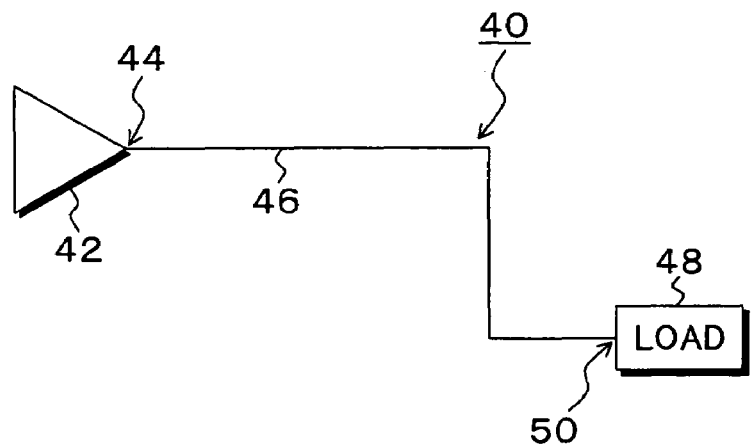

FIGS. 8A and 8B are explanatory diagrams of a circuit board executing analysis of transmission signals at the signal transmission analysis apparatus 10 in FIG. 6 and a wiring model. FIG. 8A is an example of the circuit board 32 to be used for transmission signal analysis. This circuit board 32 is equipped with a CPU 34. The CPU 34 has a bridge 35-1 and a bridge 35-2. For example, from the bridge 35-2 a bus 36 comes out and the bus is connected to a HDD connector 38 in charge of connecting hard disk drive.

The design information about the circuit board 32 as described above is created through the design operation by CAD and stored in the circuit design data file 12 in FIG. 6 in advance. FIG. 8B takes out the wiring model 40 of the bus 36 in the circuit board 32 in FIG. 8A.

In the wiring model 40, a driver 42 is placed at one end of a line 46. The output end of the driver 42 is a sending end 44. At the other end of the line 46, a load 48 is connected. The connecting point of the load 48 is a receiving end 50.

The line length of the line 46, the driver 42 of the sending end 44, the load 48 of the receiving end, and the circuit element around the line 46 are all designated by the wiring model designation unit 14 and are input from the circuit design data file 12 to the 3-D electromagnetic analysis unit 16 as designated parameters required for the 3-D electromagnetic field analysis.

In case of Finite Difference Time-Domain Method (FDTD), for example, the 3-D electromagnetic field analysis unit 16 sets up the 3-D electromagnetic analysis space in the line 46 of the wiring model 40 when the 3-D electromagnetic field analysis unit receives the input of such designated parameters from the circuit design data file 12 and divides the analysis space into minute rectangular solids (cells) using the rectangular coordinate system. Then the 3-D magnetic field analysis unit 16 uses Maxwell's equation to calculate how electromagnetic waves travel to the receiving end 50 when signals are input to the sending end 44. The targets of calculation include the portion of the line 46 and the electromagnetic field around the line 46. The 3-D magnetic field analysis unit displays the results of the analysis in the representation of voltage (or current) at the end of the analysis.

FIGS. 9A to 9J are time charts decomposing random signals used for the analysis of transmission signal in the invention. FIG. 9A is the beginning 8 bits portion of the random input signal Ei. The portion is input to the sending end of the wiring model 40 as shown in FIG. 8B and the waveforms received the influences of the return noise at the receiving end 50 are sought. From these waveforms eye pattern is displayed on the display unit.

The random input signal Ei to be used for displaying eye pattern usually have the length of about 100 bits. In the invention, the random input signals of 100 bits described above are not used. The method employed in the invention is intended for the wiring model shown in FIG. 8B and analyzes two types of signals using the 3-D electromagnetic field analysis. The two types of signals are the first input signal pattern changing from 0 to 1, the basic signal pattern of the random input signals Ei. The second input signal pattern is the signals changing from 1 to 0 in the opposite direction.

From this 3-D electromagnetic field analysis, a first output waveform and a second output waveform receiving return noise at the receiving end 50 are generated. Next, the output waveforms obtained from the 3-D electromagnetic field analysis of the two types of input signal pattern are synthesized. As the result, the random input signals Ei originally tried to obtain are input to the sending end 44 of the wiring model 40 to obtain output waveforms receiving influences of return noise at the receiving end 50.

When a first bit signal decomposition E1 to be 100 bits shown in FIG. 9A is decomposed, it becomes clear that the first bit signal decomposition E1 is the signal synthesized from the signals shown from the first bit decomposition signal E1 to the seventh bit decomposition signal E7 as shown in the signals from FIG. 9B to FIG. H. In this case, the synthesis of the signals from the first bit signal decomposition E1 to the seventh bit signal decomposition E7 is the synthesis as Exclusive Or (EXOR).

It becomes clear that the decomposition signal of each bit is one of the two types of basic signal in looking at the decomposition signal of each bit decomposed from the random input signal IE. The two basic types of signal are the first input signal pattern changing from 0 to 1 shown in FIG. 10A and the second input signal pattern changing from 1 to 0 shown in FIG. 10B.

Figure 10A:
FIGS. 10A to 10C are time charts of two basic input patterns used in the transmission signal analysis of the invention.
Figure 10B:
Figure 10C:

To reproduce the random input signals Ei as shown in FIG. 9A, the two types of signal shown in FIG. 10A and FIG. 10B are used. At bit 1, the first input signal pattern is selected. Next, at bit 0 the second input signal pattern is selected. At each bit, timing is delayed. In this way, the random input signals Ei as shown in FIG. 9A are synthesized.

As described above, the random input signals Ei is synthesized and reproduced in using the first input signal pattern and the second input signal pattern with timing delay. In applying this approach to the output waveforms after transmission signal, the synthesis and the reproduction are thought to be equal with the case of the input waveforms.

Figure 11A:
FIGS. 11A and 11B are time charts of a first output signal pattern generated in a 3-D electromagnetic field analysis of a first input signal pattern changing from 0 to 1 input to the sending end of the line model.
Figure 11B:
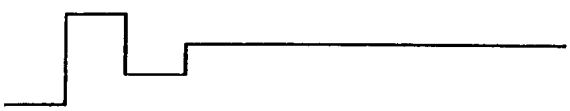

FIGS. 11A and 11B show the first analysis output pattern in FIG. 11B. In obtaining a first analysis output pattern, the first input signal pattern in 11A is input to the sending end 44 of the wiring model 40 in FIG. 8B and the first analysis unit 18 shown in FIG. 6 conducts the 3-D electromagnetic field analysis to obtain the first analysis output pattern at the receiving end 50.

Figure 12A:
FIGS. 12A and 12B are 3time charts of a second output signal pattern generated in a 3-D electromagnetic field analysis of a second input signal pattern changing from 1 to 0 input to the sending end of the line model.
Figure 12B:
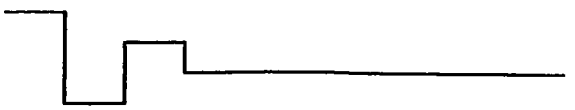

FIGS. 12A and 12B show the second analysis output pattern in FIG. 12B. In obtaining the second analysis output pattern, the second signal pattern in 12A is input to the receiving end 50 of the wiring model 40 in FIG. 8B and the second analysis unit 20 shown in FIG. 6 conducts the 3-D electromagnetic field analysis to obtain the second analysis output pattern at the receiving end 50.

As described above, the analysis output patterns receiving the influences of return noise are obtained through 3-D electromagnetic analysis processing. The first analysis output pattern in FIG. 11B and the second analysis output pattern in 12B are synthesized with delay in timing as in the case of the random input signal Ei in FIGS. 9A to 9J. From this synthesis, the random input signals Ei of 100 bits are transmitted and the output waveforms receiving return noise obtained at receiving end 50 are generated. The output waveforms are needed for displaying eye pattern.

FIGS. 13A to 13J are time charts of the output signals at the receiving end 50 of the wiring model shown in FIG. 8B generated matching each bit of the random input signal Ei shown in FIG. 9A in timing and the synthesis output signal.

The first bit of the random input signal Ei shown in FIG. 9A is bit 1. Therefore, the first bit output signal E101 of FIG. 13A selects the first analysis output pattern shown in FIG. 11B. The second bit of the random input signal Ei shown in FIG. 9A is 0. Therefore, for the second bit output signal E102 in FIGS. 13A to 13J the second analysis output pattern in FIG. 12B is selected and generation is done delaying timing for 1 bit to the first output signal E101.

The third bit, the fourth bit, the fifth bit, the sixth bit, the seventh bit, the eighth bit, and the ninth bit are also handled in the same way. The first analysis output pattern in FIG. 11B or the second analysis output pattern in FIG. 12B is selected for generation corresponding to the bit "11001" in the random input signal Ei delaying timing by each bit as shown in the output signal from FIG. 13C to FIG. 13I.

In this way the first analysis output pattern or the second analysis output pattern is selected and the bit output signals are generated from the first bit of the dummy random signal Ei to the last 100th bit delaying timing by 1 bit all the way through. FIGS. 13A to 13J show as far as the ninth bit. Illustration on bits to be followed the ninth bit is omitted.

When the generation of the bit output signals corresponding to 100 bits of the dummy random signals is finished, the 100th output signal E200 is synthesized from a first bit output signal E101 generated and the synthesis output signal $E_O$ shown in FIG. 1-3J is generated. FIGS. 13A to 13J show the synthesis of the portion from the output signals E101 to E109 of the first bit to the ninth bit.

The synthesis of the output signal of each bit is determined by bit period of the random input signal Ei. In addition, waveform synthesis is conducted as the total of the positive or negative change of 1 or plural output waveforms in each timeliness for judgment to be the waveform change of the synthesis output signal.

FIGS. 14A to 14J specifically show the generation of the synthesis output signals in synthesis of the first bit output signal E101 to the ninth signal E109. In each of the signals spanning from the first bit output signal E101 to the ninth output signal E109 in FIGS. 14A to 14I change of the rising portion of the output signal is to be plus and the change in the falling portion is to be minus. The change of each bit is shown in the amount of change a to r.

In time t1, the variation of the first bit output signal E101+a becomes synthesis output signal $E_O$. In time t2, the sum of the variation of the falling portion of the first bit output signal E101 and the variation of the second bit output signal E102 (b+c) becomes the variation of the synthesis output signal $E_O$.

In time t3, the sum of the signal variation of the rising of each of the first bit output signal E101, the second bit output signal 102, and the third bit output signal E103 $d, e, f$ (d+e+f) becomes the variation of the synthesis output signal $E_O$.

In the next time t4, the variation of the output signal of the synthesis becomes (g+h). In the subsequent time t5, the variation of the third bit output signal E103 is +i. On the other hand, the variation of the fifth bit output signal E105 is −j, and the variation of the synthesis output signal $E_O$ is (j−i) in this case because the variation is to the opposite direction.

For each of the remaining time t6, t8, t9, the variation of the synthesis output signal $E_O$ is the additional value corresponding to the direction of plus or minus of the variation of the bit output signal changing each time.

Figure 13A:
FIGS. 13A to 13J are time charts of output signals at the receiving end generated matched with the timing of each bit of random signals and the time chart of the synthesis output signals.
Figure 13B:
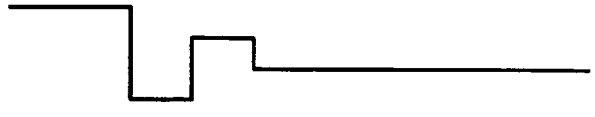
Figure 13C:
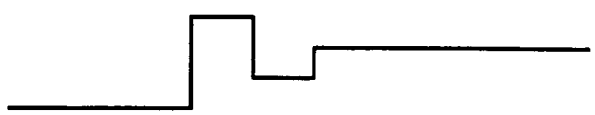
Figure 13D:
Figure 13E:
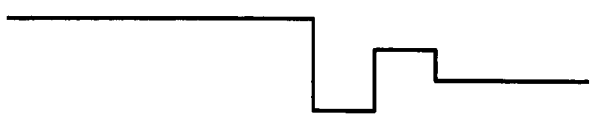
Figure 13F:
Figure 13G:
Figure 13H:
Figure 13I:
Figure 13J:
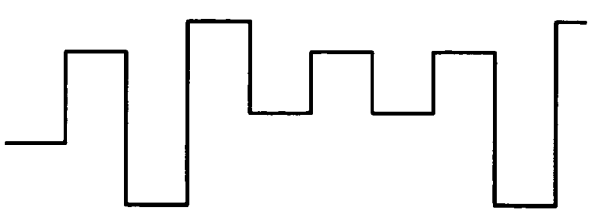
Figure 15:
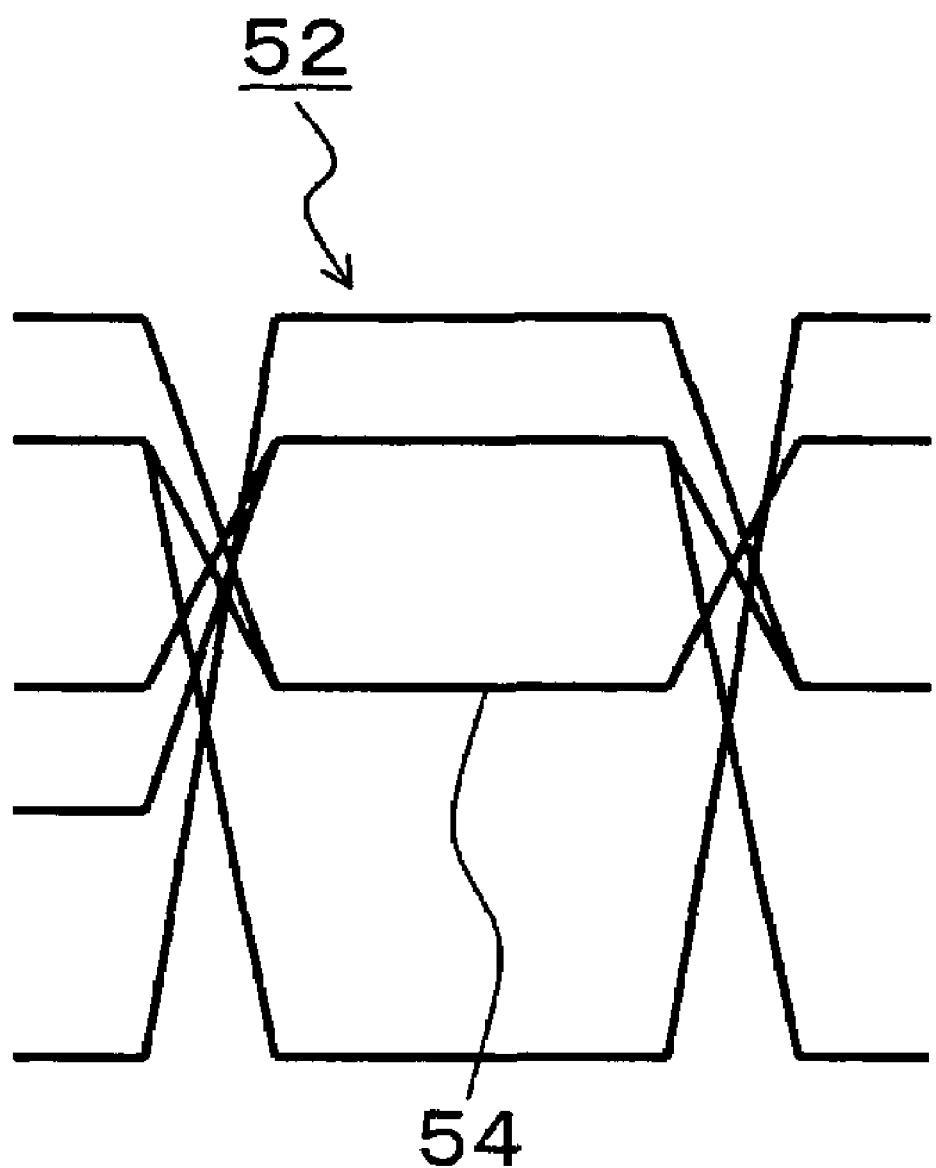
FIG. 15 is an explanatory diagram of an eye pattern generated from the synthesis output signals of FIGS. 13A to 13J.

FIG. 15 shows an eye pattern obtained from the generated synthesis output signal $E_O$ as in FIG. 13J. In this eye pattern 52 every 1 bit of the synthesis output signal $E_O$ of FIG. 13J is superimposed on top of another and displayed as widely known. In the eye pattern 52, an arrow 54 clearly indicates the portion indicated by the arrow 54 is the undesirable portion reaching the level the load error occurs due to the return noise.

Figure 16:
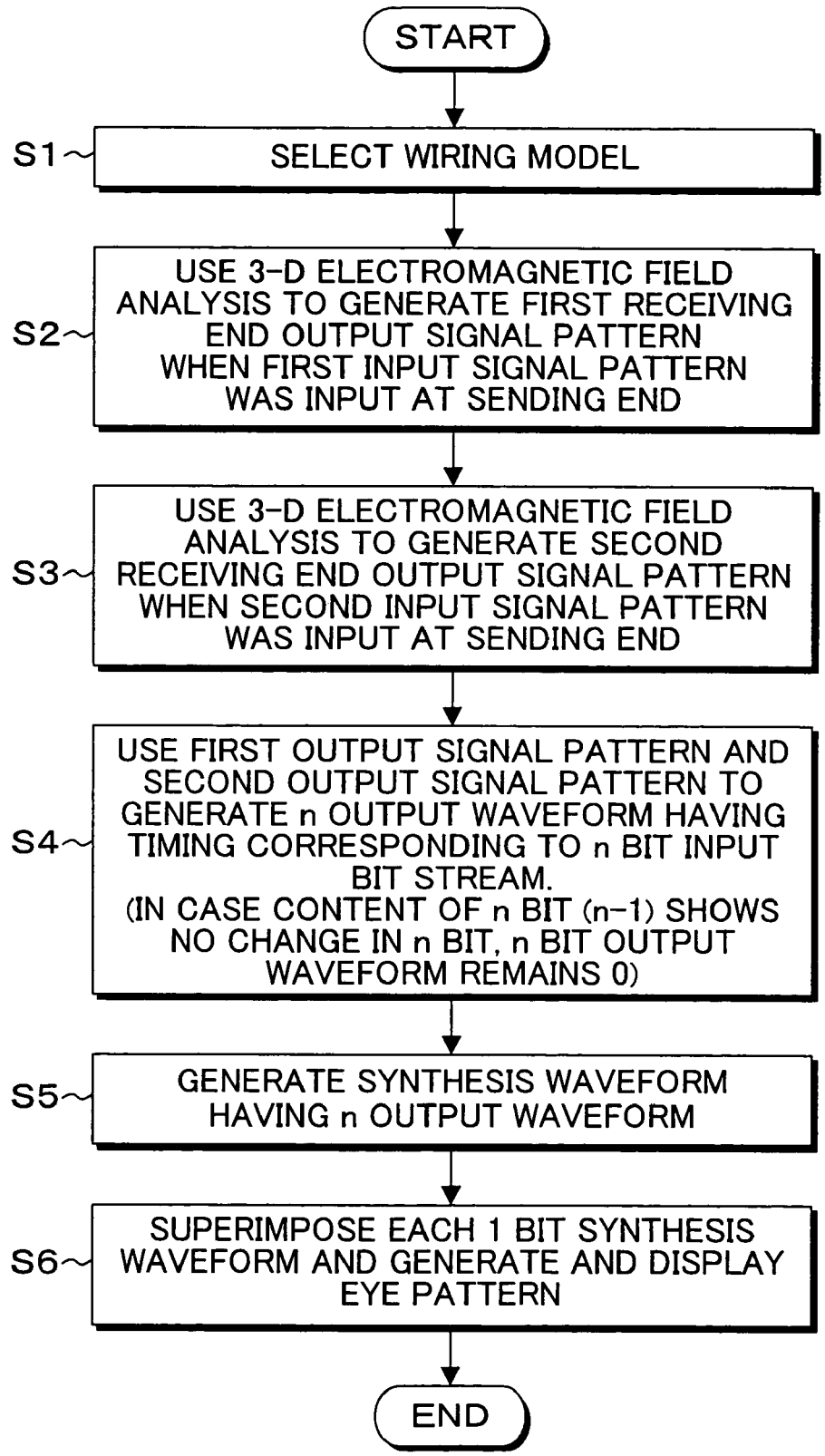
FIG. 16 is a flowchart of transmission signal analysis processing according to the invention.

FIG. 16 is a flowchart of a transmission signal analysis processing according to the present invention. The processing steps in the flowchart represent the processing steps of the transmission signal analysis processing program according to the present invention. The following is an explanation of the transmission signal analysis processing with FIG. 6.

Step S1: Select the wiring model to conduct signal analysis from the circuit board design information stored in the circuit design data file.

Step S2: Input the first input signal pattern rising from 0 to 1 shown in FIG. 10A at the sending end of the wiring model.). Use the 3-D electromagnetic field analysis to generate the first output signal pattern at the receiving end.

Step S3: Use the 3-D space electromagnetic analysis to generate the second output signal pattern at the receiving end when the second input signal pattern shown in FIG. 10B was input to the sending end of the wiring model.

Step S4: Use the first output signal pattern and the second output signal pattern generated through the 3-D electromagnetic field analysis and generate the output waveforms of n bits having time delay corresponding to the input bit stream of dummy random signal of n bits, for example 100 bits.

Step S5: Generate the synthesis waveforms of n output waveforms.

Step S6: Superimpose synthesis waveforms by 1 bit to generate and display eye pattern.

The most time consuming processing in the transmission signal analysis processing in FIG. 16 is the processing of generating the output waveforms of the receiving end of the wiring model using the 3-D electromagnetic field analysis in Step S2 and Step S3. In comparison with the time consuming 3-D electromagnetic field analysis, processing performed in Step S4 and Step S5 ends in a moment of time as a computer based processing. In Step S4, two types of output waveforms corresponding to each bit of the random signal are selected and output signals are generated in accord with the bit timing and delaying time. These two types of output waveforms are obtained from the 3-D electromagnetic field analysis. In Step S5, n of the output waveforms are synthesized. The speed of the processing is also the same with the generation and display of eye pattern performed in Step S6.

For the reason explained above, the processing time of the transmission signal analysis processing is mainly time needed for generation processing for the output waveforms at the receiving end through the 3-D electromagnetic analysis intended for the wiring model of the two types of the first input signal pattern and the second input signal pattern in Steps S2 and S3. In the past, the generation of the output waveforms at the receiving end through the 3-D electromagnetic field analysis was performed with the entire bits of dummy random signal with 100 bits. Compared with the method employed up to now, the method of this invention is limited to the two types of input signal patterns.

Therefore, in comparison with the conventional 3-D electromagnetic field analysis the processing time of this invention saves time substantially. In a way of example, the processing time is one tenth of the time needed in the past. Specifically, if five hours are needed for the 3-D electromagnetic field analysis with the use of the random signals of 100 bits, for example, the analysis according to the invention can come up with the result in about 30 minutes. It is because in the invention the analysis of the two types of the input signal pattern is performed until the round trip of the transmission line for three times are executed. It is because after the round trip of two or three times, the influences of the return noise fall to the level that is simply ignored. After that what is needed is to keep the last voltage.

In using the transmission signal analysis processing of the invention, the processing speed can be raised nearly ten times of that of the conventional transmission line analysis assuming the conventional analysis is the transmission line analysis that uses the 3-D electromagnetic field analysis to display eye pattern.

The processing time increases as the number of bits of the random signals increases in the analysis processing using the conventional 3-D electromagnetic field analysis to display eye pattern. Even if the number of bits of the random signals increases, the processing to perform the 3-D electromagnetic field analysis is the same as the processing of the two or three times on two types of input signal patterns in this invention. Therefore, the processing time scarcely increases even if the number of bits of the random signals doubles to 200.

The transmission signal analysis apparatus of the invention is intended for transmission signal analysis in the circuit board that needs the 3-D electromagnetic field analysis whose operating frequency of CPU exceeds 1 GHz. The invention can be applied equally to the operating frequency having problems with return noise even if the operating frequency is less than 1 GHz.

The embodiments described above used Finite Difference Time-Domain Method (FDTD) as the 3-D electromagnetic field analysis method in the way of example. However, the invention can be applied to other 3-D electromagnetic field analysis method such as Finite Element Method (FEM) and Boundary Element Method (BEM).

The present invention encompasses proper modifications without impairing the objects and advantages thereof and is not restricted by numerical values shown in the above embodiments.

The invention claimed is:

1. A computer-readable medium storing a program for analyzing a transmission signal, wherein said program allows a computer to execute:

designating a wiring model including a sending end and a receiving end for signal analysis from a design information of a circuit board;

analyzing comprising analyzing and generating first output waveforms received at the receiving end when a signal pattern varying from 0 to 1 is input to the sending end, and analyzing and generating second output waveforms received at said receiving end when a signal pattern varying from 1 to 0 is input to said sending end;

output waveform generating comprising selecting said first and second waveforms depending on the bits of a random signal of a predetermined bit count and generating, for the predetermined bit count, said first and second output waveforms selected with each bit position as a starting point; and waveform synthesizing comprising synthesizing the output waveforms for the predetermined bit count to generate output waveforms received at the receiving end when the random signal is input to the sending end.

2. The computer-readable medium storing a program according to claim 1, wherein designating a wiring model comprises connecting a wiring and a load to the receiving end.

3. The computer-readable medium storing a program according to claim 1, wherein the analyzing includes analyzing and generating output waveforms for the time a return noise subsides.

4. The computer-readable medium storing a program according to claim 1, wherein the analyzing includes analyzing and generating output waveforms for the time equal to several times of the signal transmission time.

5. The computer-readable medium storing a program according to claim 1, wherein the analyzing includes using a 3-D electromagnetic analysis of the wiring model to generate the output waveforms.

6. The computer-readable medium storing a program according to claim 1, wherein the analyzing includes analyzing the output waveforms with the transmission clock frequency of the wiring model equal to or greater than 1 GHz.

7. A transmission signal analysis method comprising:

designating a wiring model including a sending end and a receiving end for signal analysis from a design information of a circuit board;

analyzing comprising analyzing and generating first output waveforms received at the receiving end when a signal pattern varying from 0 to 1 is input to the sending end, and analyzing and generating second output waveforms received at said receiving end when a signal pattern varying from 1 to 0 is input to said sending end;

output waveform generating comprising selecting said first and second waveforms depending on the bits of a random signal of a predetermined bit count and generating, for the predetermined bit count, said first and second output waveforms selected with each bit position as a starting point; and waveform synthesizing of synthesizing the output waveforms for the predetermined bit count to generate output waveforms received at the receiving end when the random signal is input to the sending end.

8. The method according to claim 7, wherein a wiring and a load are connected to the receiving end.

9. The method according to claim 7, wherein the analyzing includes analyzing and generating output waveforms for the time a return noise subsides.

10. The method according to claim 7, wherein the analyzing includes analyzing and generating output waveforms for the time equal to several times of the signal transmission time.

11. The method according to claim 7, wherein the analyzing includes using a 3-D electromagnetic analysis of the wiring model to generate the output waveforms.

12. A transmission signal analysis apparatus comprising:

a wiring model designation unit designating a wiring model including a sending end and a receiving end for signal analysis from a design information of a circuit board;

an analysis unit analyzing and generating first output waveforms received at the receiving end when a signal pattern varying from 0 to 1 is input to the sending end, and analyzing and generating second output waveforms received at said receiving end when a signal pattern varying from 1 to 0 is input to said sending end;

an output waveform generation unit selecting said first and second waveforms depending on the bits of a random signal of a predetermined bit count, the output waveform generation unit generating, for the predetermined bit count, the output waveforms selected with each bit position as a starting point; and a waveform synthesis unit synthesizing the output waveforms for the predetermined bit count to generate output waveforms received at the receiving end when the random signal is input to the sending end.

13. The apparatus according to claim 12, wherein a wiring and a load are connected to the receiving end.

14. The apparatus according to claim 12, wherein the analysis unit analyzes and generates output waveforms for a time a return noise subsides.

15. The apparatus according to claim 12, wherein the analysis unit analyzes and generates output waveforms for the time equal to several times of the signal transmission time.

16. The apparatus according to claim 12, wherein the analysis unit uses a 3-D electromagnetic analysis of the wiring model to generate the output waveforms.

17. The apparatus according to claim 12, wherein the analysis unit analyzes the output waveforms with the transmission clock frequency of the wiring model equal to or greater than 1 GHz.

* * * * *

UNITED STATES PATENT AND TRADEMARK OFFICE
CERTIFICATE OF CORRECTION

| | |
|---|---|
| PATENT NO. | : 7,398,504 B2 |
| APPLICATION NO. | : 11/203118 |
| DATED | : July 8, 2008 |
| INVENTOR(S) | : Kazuhiko Tokuda |

It is certified that error appears in the above-identified patent and that said Letters Patent is hereby corrected as shown below:

Column 13, Line 28, in claim 9, after "for" change "the" to --a--.

Column 13, Line 32, in claim 10, before "time" change "the" to --a--.

Column 14, Line 28, after "for" change "the" to --a--.

Signed and Sealed this

Eleventh Day of November, 2008

JON W. DUDAS
*Director of the United States Patent and Trademark Office*